Aug. 5, 1969 J. E. McTAGGART 3,459,965

DIRECT COUPLED TRANSISTOR AMPLIFIER-LIMITER

Filed May 9, 1966

INVENTOR.
JAMES E. McTAGGART
BY
PATENT AGENT

United States Patent Office 3,459,965

Patented Aug. 5, 1969

3,459,965

DIRECT COUPLED TRANSISTOR AMPLIFIER-LIMITER

James E. McTaggart, Waterloo, Ontario, Canada, assignor to Electrohome Limited, Kitchener, Ontario, Canada Filed May 9, 1966, Ser. No. 548,657
Int. Cl. H03k 5/08
U.S. Cl. 307—237 7 Claims

ABSTRACT OF THE DISCLOSURE

A direct coupled transistor amplifier-limiter for an F.M. receiver includes an NPN and a PNP transistor, the emitter of the first transistor being direct coupled to the base of the second. Input signals are applied to the base of the first transistor, and it is forward biased under no signal conditions, as is the base-emitter junction of the second transistor. Parallel tuned circuits are connected between the base and collector of the first transistor and between the emitter and collector of the second transistor. A tuned interstage coupling circuit is eliminated.

This invention relates to direct coupled transistor amplifier-limiters particularly for F.M. I.F., e.g., television sound reception and F.M. radio sound reception, and to television or F.M. radio receivers employing the same.

Prior art amplifier-limiter networks for F.M. I.F. have employed tuned interstage coupling circuits between the two stages of the networks. Generally speaking, tuned interstage coupling circuits are expensive and entail a labour cost for alignment.

In accordance with this invention, there is provided a direct coupled transistor amplifier-limiter. Since interstage coupling is direct, the interstatge coupling circuit is quite inexpensive. At the same time, by employing transistors of opposite conductivity type, i.e. NPN and PNP, in the input and output stages, overload effects, which would occur if two transistors of the same conductivity type were used in direct coupled configuration, are reduced or eliminated.

A direct coupled transistor amplifier-limiter embodying this invention comprises first and second transistors each having base, collector and emitter electrodes. One of the transistors is an NPN transistor, while the other is a PNP transistor. The emitter electrode of the first transsistor and the base electrode of the second transistor are direct coupled. Means are provided for forward biasing the first transistor under no signal conditions and for forward biasing the base-emitter junction of the second transistor under no signal conditions. First and second parallel tuned circuits tuned to the frequency of the signal to be amplified by the amplifier-limiter are connected between the base and collector electrodes of the first transistor and the emitter and collector electrodes of the second transistor respectively. An input terminal to which the signal to be amplified is applied is connected to the base electrode of the first transistor.

Figure 1:
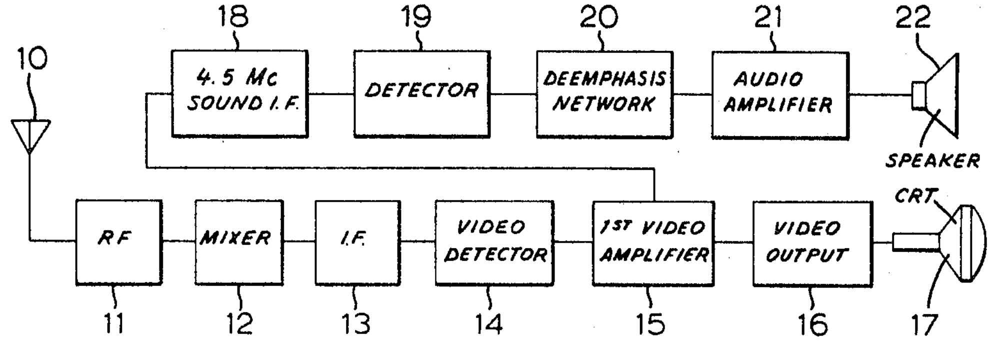
Figure 2:
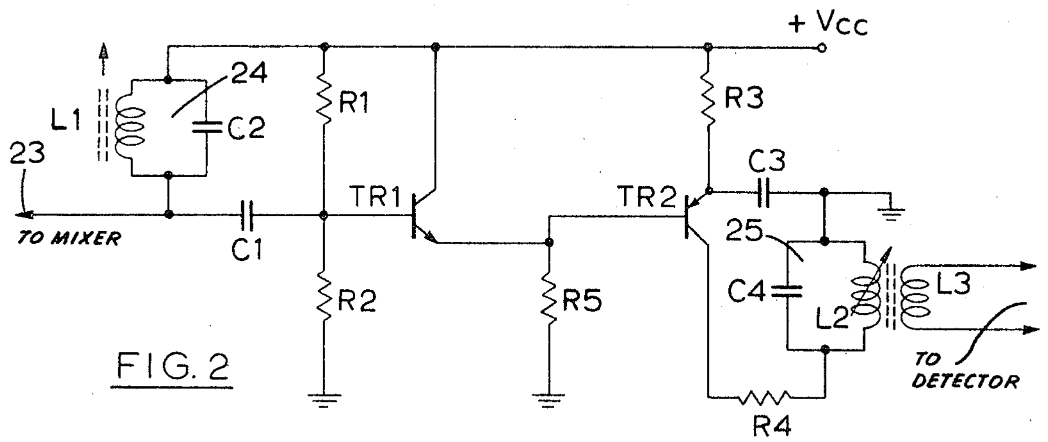
Figure 3:
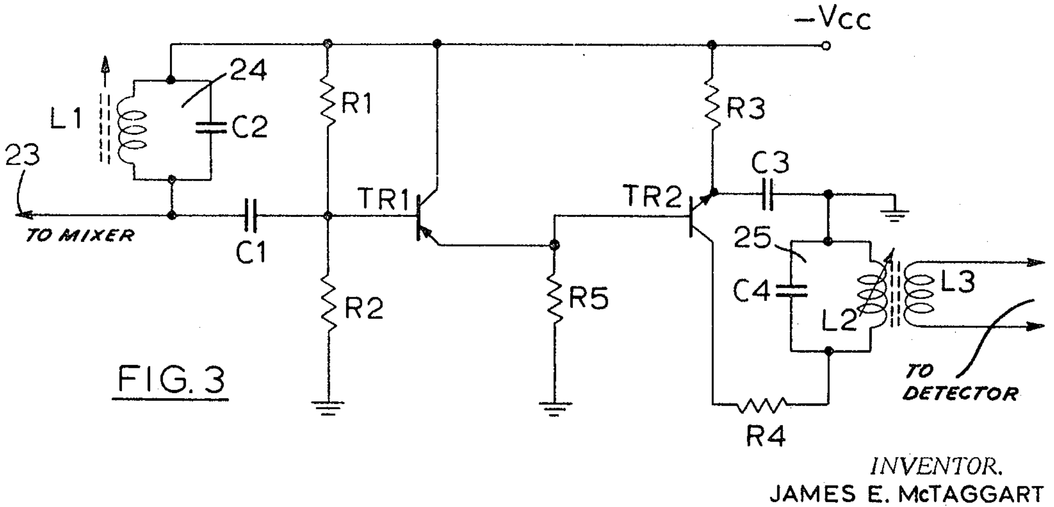

This invention will become more apparent from the following detailed description, taken in conjunction with the appended drawings, in which:

FIGURE 1 is a block diagram of a television receiver utilizing an amplifier-limiter embodying this invention; and FIGURES 2 and 3 are circuit diagrams of amplifier-limiters embodying this invention.

Referring to FIGURE 1, there is shown a television receiver which is conventional in nature except for the provision of an amplifier-limiter embodying this invention. The television receive consists of an antenna 10, an R.F. section 11 (tuner and R.F. amplifier), a mixer 12, an I.F. section 13, a video detector 14, a first video amplifier 15, video output circuits 16, a cathode ray tube 17 and a sound reproducing system connected to first video amplifier 15 and consisting of an amplifier-limiter 18 embodying this invention, a detector 19, a de-emphasis network 20, an audio amplifier 21, and a loudspeaker 22.

Amplifier-limiter 18 is shown in greater detail in FIGURE 2, to which reference now is made. The amplifier-limiter has an input stage and an output stage, the former including an NPN transistor TR1 and the latter including a transistor TR2 of opposite conductivity type, i.e., a PNP transistor.

Coupled to the base electrode of transistor TR1 by a coupling capacitor Cl is an input terminal 23 that is connected to video amplifier 15 (see FIGURE 1) and to which the F.M. I.F. signal to be amplified and limited is applied.

Connected between the base and collector electrodes of transistor TR1 is a parallel tuned circuit 24 that consists of a coil L1 of variable inductance and a capacitor C2. Tuned circuit 24 is tuned to the sound I.F. (4.5 mc.).

A source of positive potential, $+V_{cc}$, which may be +10 volts, for example, is connected to the collector electrode of transistor TR1. Resistors R1 and R2, the latter being connected between the base electrode of transistor TR1 and ground, and the former being connected between $+C_{cc}$ and the base electrode of transistor TR1, form a biasing network for transistor TR1.

The emitter electrode of transistor TR2 is connected via an emitter resistor R3 to $+V_{cc}$.

The emitter-collector circuit of transistor TR2 includes a parallel tuned circuit 25, one terminal of which is grounded, an emitter by-pass capacitor C3 connected between the aforementioned grounded terminal and the emitter electrode of transistor TR2, and a resistor R4 connected between the other terminal of parallel tuned circuit 25 and the collector electrode of transistor TR2.

Parallel tuned circuit 25 consists of a coil L2 of variable inductance and a capacitor C4. Tuned circuit 25 also is tuned to the sound I.F. of the television receiver.

Transformer coupled to coil L2 is a coil L3 which couples the signal developed across coil L2 of parallel tuned circuit 25 to detector 19 (FIGURE 1).

Transistors TR1 and TR2 are direct coupled. Thus, as will be seen by reference to FIGURE 2, the emitter electrode of transistor TR1 is directly connected to the base electrode of transistor TR2. In order to provide for proper biasing of transistor TR2, a resistor R5 is connected between a terminal at a reference potential, in the present case ground potential, and both the emitter electrode of transistor TR1 and the base electrode of transistor TR2.

The circuit of FIGURE 3 is the same as that shown in FIGURE 2 except that transistor TR1 is a PNP transistor, transistor TR2 is an NPN transistor, and the source of positive potential $+V_{cc}$ has been replaced by a source of negative potential, $-V_{cc}$.

The operation of the direct coupled transistor amplifier-limiter shown in FIGURE 2 now will be described. It is essential to the operation of this circuit that with no signal input applied to input terminal 23, the base-emitter junction of transistor TR2 must be forward biased. In the circuit of FIGURE 2 transistor TR1 is forward biased, and, by proper selection of resistor R5, it can be assured that under no signal conditions the voltage drop across resistor R5 will be less than the voltage appearing at the emitter electrode of transistor TR2. Thus, whereas the emitter voltage of transistor TR2 under no signal conditions may be, for example, +7 volts, by proper selection of resistor R5, the voltage drop across resistor R5, which is the same thing as the voltage applied to the base electrode of transistor TR2, may be less than 7 volts. In the circuit of FIGURE 3, by proper selection of resistor R5, the base voltage applied to transistor TR2 under no signal conditions can be made less negative than the voltage applied to the emitter electrode of transistor TR2, thus ensuring forward biasing of the base-emitter junction of transistor TR2.

The operation of the circuit of FIGURE 2 first will be discussed with a weak signal applied to input terminal 23. Under these circumstances, on the positive-going half cycles of the signal applied to the base electrode of transistor TR2 there will be a decrease in the base current of transistor TR2 and a resultant decrease in the collector current of this transistor, which will result in a negative-going voltage at the collector electrode of transistor TR2, i.e. the collector voltage of transistor TR2 will be 180° out of phase with respect to the base voltage of transistor TR2. On negative-going half cycles of the voltage applied to the base electrode of transistor TR2, a positive-going swing will occur at the collector electrode of transistor TR2.

Under strong signal conditions, when the voltage applied to the base electrode of transistor TRR2 is positive going, the base current of this transistor will be reduced to zero for a part of the cycle, and the collector voltage of transistor TR1, which will be negative-going under these circumstances, will be limited because of transistor TR2 being driven to cut-off. On negative-going half cycles of the voltage applied to the base electrode of transistor TR2, transistor TR2 will be driven to saturation, and the resultant positive-going voltage at the collector electrode of transistor TR2 will be such that the instantaneous collector voltage equals or slightly exceeds the instantaneous base voltage, so that the base-collector junction of transistor TR2 becomes forward biased for a portion of the half cycle, thereby permitting current to flow through the base-collector junction and clamping the excursion of the collector voltage of transistor TR2 approximately to the minimum value of the base voltage applied to the base electrode of transistor TR2.

Resistor R4 has the effect of "softening" the limiting action, reducing spurious harmonic generation and improving the stability of the circuit. Resistor R4 is not essential to the operation of the circuit, but its presence is desirable for the reasons noted hereinbefore.

It will be noted that transistor TR1 is connected in emitter-follower configuration. Thus transistor TR1 has a high input impedance and a low output impedance, so that the first stage of the circuit of FIGURE 2 operates relatively independently of the output stage. Also parallel tuned circuit 24 is relatively unaffected by the operation of transistor TR1, because this transistor has a high input impedance, so that the Q of parallel tuned circuit 24 remains relatively constant.

The operation of the circuit of FIGURE 3 is the same as the operation of the circuit of FIGURE 2 with appropriate changes in the polarities involved. As in the case of the circuit of FIGURE 2, transistor TR2, for large signal operation, is driven between cut-off and saturation, whereby limiting of the collector voltage excursions thereof on both the positive-going and negative-going half cycles occurs.

While preferred embodiments of this invention have been disclosed herein, those skilled in the art will appreciate that changes and modifications may be made therein without departing from the spirit and scope of this invention as defined in the appended claims.

The embodiments of the invention in which an exclusive property or privilege is claimed are defined as follows:

1. A direct coupled transistor amplifier-limiter for an

F.M. receiver comprising first and second transistors each having base, collector and emitter electrodes, one of said transistors being an NPN transistor, the other of said transistors being a PNP transistor; means direct coupling said emitter electrode of said first transistor and said base electrode of said second transistor; first and second parallel tuned circuits tuned to the frequency of the signal to be amplified by said amplifier-limiter, one of said tuned circuits being connected between said base and collector electrodes of said first transistor, the other of said tuned circuits being connected between said emitter and said collector electrodes of said second transistor; an input terminal connected to said base electrode of said first transistor and to which said signal is applied; and means forward biasing said first transistor and the base-emitter junction of said second transistor under no signal conditions.

2. The invention according to claim 1 wherein the last-mentioned means include first and second terminals at different potentials, a first resistor connected between said first terminal and said base electrode of said first transistor, a second resistor connected between said base electrode of said first transistor and said second terminal, and a third resistor connected between said second terminal and both said emitter electrode of said first transistor and said base electrode of said second transistor.

3. The invention according to claim 2 wherein said first transistor is an NPN transistor and said second transistor is a PNP transistor, the potential of said first terminal being positive relative to the potential of said second terminal.

4. The invention according to claim 2 wherein said first transistor is a PNP transistor and said second transistor is an NPN transistor, the potential of said first terminal being negative relative to the potential of said second terminal.

5. The invention according to claim 2 including a fourth resistor connected between said emitter electrode of said second transistor and said first terminal, said first terminal also being connected to said collector electrode of said first transistor.

6. The invention according to claim 1 wherein said other tuned circuit has two terminals, one of said termiminal at a reference potential; a capacitor connected between said emitter electrode of said second transistor and said terminal at said reference potential; and a fifth resistor connected between the other of said terminals of said other tuned circuit and said collector electrode of said second transistor.

7. The invention according to claim 5 wherein said other tuned circuit has two terminals, one of said terminals of said other tuned circuit being connected to a terminal at a reference potential; a capacitor connected between said emitter electrode of said second transistor and said terminal at said reference potential; and a fifth resistor connected between the other of said terminals of said other tuned circuit and said collector electrode of said second transistor.

References Cited

UNITED STATES PATENTS 2,912,573 11/1959 Mitchell ------------ 325—319

KATHLEEN CLAFFY, Primary Examiner

CHARLES JIRAUCH, Assistant Examiner

U.S. Cl. X.R.

325—347; 328—169; 329—134